United States Patent
Kwon et al.

(10) Patent No.: US 10,319,461 B2
(45) Date of Patent: Jun. 11, 2019

(54) LOW-OVERHEAD MECHANISM TO DETECT ADDRESS FAULTS IN ECC-PROTECTED MEMORIES

(71) Applicant: Intel Corporation, Santa Clara, CA (US)

(72) Inventors: Kon-Woo Kwon, Hillsboro, OR (US); Vivek Kozhikkottu, Hillsboro, OR (US); Dinesh Somasekhar, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 105 days.

(21) Appl. No.: 15/197,590

(22) Filed: Jun. 29, 2016

(65) Prior Publication Data

US 2018/0004597 A1  Jan. 4, 2018

(51) Int. Cl.
| | |
|---|---|
| *G11C 29/00* | (2006.01) |
| *G11C 29/52* | (2006.01) |
| *G06F 11/10* | (2006.01) |
| *G11C 29/02* | (2006.01) |
| *G11C 29/42* | (2006.01) |

(52) U.S. Cl.
CPC .......... *G11C 29/52* (2013.01); *G06F 11/1048* (2013.01); *G06F 11/1068* (2013.01); *G11C 29/024* (2013.01); *G11C 29/42* (2013.01)

(58) Field of Classification Search
CPC .... G06F 11/1068; G06F 3/0619; G06F 3/064; G06F 11/1048; G11C 29/52; G11C 29/024; G11C 29/42

USPC ....... 714/768, 767, 799, 800, 805, 807, 764, 714/763, 758; 365/230.06, 230.01; 711/200

See application file for complete search history.

(56) References Cited

U.S. PATENT DOCUMENTS

| | | | | |
|---|---|---|---|---|
| 5,768,294 | A  * | 6/1998 | Chen ................... | G06F 11/1016 704/229 |
| 7,203,890 | B1 | 4/2007 | Normoyle | |
| 8,413,010 | B1 * | 4/2013 | Vasquez ............ | H03M 13/3746 714/758 |
| 2008/0235558 | A1 * | 9/2008 | Normoyle ........... | G06F 11/1016 714/757 |
| 2010/0241924 | A1 * | 9/2010 | Nishi ...................... | H03M 7/30 714/758 |

OTHER PUBLICATIONS

Noha, Frank, "ECC Handling in TMSx70-Based Microcontrollers", ECC Handling in TMSx70-Based Microcontrollers, SPNA 126—Feb. 2011, 21 pages(s), Texas Instruments, Post Office Box 655303, Dallas, Texas 75265.

* cited by examiner

*Primary Examiner* — Christine T. Tu
(74) *Attorney, Agent, or Firm* — Compass IP Law PC (57) ABSTRACT

Embodiments are generally directed to a low-overhead mechanism to detect address faults in ECC-protected memories. An embodiment of an apparatus includes a memory array; an error correction code (ECC) encoder for the memory array to encode ECC values based on a data value and a respective address value for the data value; and an ECC decoder for the memory array to decode ECC values that are based on data values and respective addresses for the data values; wherein the apparatus is to detect and correct an error in an address value based on an ECC value, address value, and data value stored in the memory.

19 Claims, 10 Drawing Sheets

| | Data width (= n) | ECC bit-width for n-bit encoding | Address width (= m) allowable with zero storage overhead |
|---|---|---|---|
| Single Error Correction (SEC) | 64 | 7 | 56 |
| | 128 | 8 | 119 |
| | 256 | 9 | 246 |
| Double Error Correction (DEC) | 64 | 14 | 49 |
| | 128 | 16 | 111 |
| | 256 | 18 | 237 |

LOW-OVERHEAD MECHANISM TO DETECT ADDRESS FAULTS IN ECC-PROTECTED MEMORIES

STATEMENT OF GOVERNMENT RIGHTS

This invention was made with Government support under contract number b608115 awarded by the Department of Energy. The Government has certain rights in this invention.

TECHNICAL FIELD

Embodiments described herein generally relate to the field of electronic devices and, more particularly, a low-overhead mechanism to detect address faults in ECC-protected memories.

BACKGROUND

Error correcting code (ECC) is a widely used technique to protect memory information against errors occurred during data transmission or retention, thereby allowing detection, correction, or both of many common errors in data. In general, ECC operates by adding a certain level of redundancy in extra data that may be referred to as ECC bits.

The ECC bits may be utilized to determine whether data includes an error and to correct the error if the number of errors are within the capability of the ECC bits. For example, an ECC system may commonly be single-error correction (SEC) or double-error correction (DEC)

However, while ECC protection for memory is capable of detecting or correcting errors in the data, errors may also occur in the memory address that identifies the location in memory where the data is stored, and ECC will not detect or correct errors in the address. This may result in storing (or loading) data into (or from) an incorrect memory location.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Embodiments described herein are generally directed to a low-overhead mechanism to detect address faults in ECC-protected memories.

For the purposes of this description:

"Error correction code" or "ECC" refers to an algorithm for expressing a sequence of numbers such that errors may be detected, corrected, or both within the limitations of the ECC. The ECC generates extra data for error correction and detection, wherein the extra data may be referred to as ECC bits.

Conventional ECC (error correction code) that is applied to protect against possible errors during data transmission or retention is performed over only data bits, and does not include any address information within the ECC bits. For this reason, a conventional ECC system or process is not capable of detecting or correcting address faults, and such address faults may result in silent data corruption.

In some embodiments, a low-overhead mechanism is to enhance ECC bit to include address information associated with data. In some embodiments, the enhanced ECC data may be generated without increasing the required ECC-bit width because of the available space for ECC allows for storage of the enhanced ECC data. In some embodiments, the address enhanced ECC data may be utilized to detect any address faults in ECC-protected memories.

In some embodiments, ECC encoding and decoding is performed over an input word that comprises both a data segment containing data and an address segment containing the address location to which the data is destined. In some embodiments, an address value may be a virtual address or a physical address in memory. On decoding, if the decoder reports an error in the code word corresponding to the address segment, a system can detect that an address corruption has occurred.

Further, there is in general no need to expand storage for enhanced ECC because the additional storage is currently available. In most practical scenarios where the data to be written or read is a power of 2 number of bits, there is no need to increase the amount of ECC bit storage to capture address faults with enhanced ECC data the ECC bits fit easily within the shortened/truncated region of the ECC.

Figure 1:
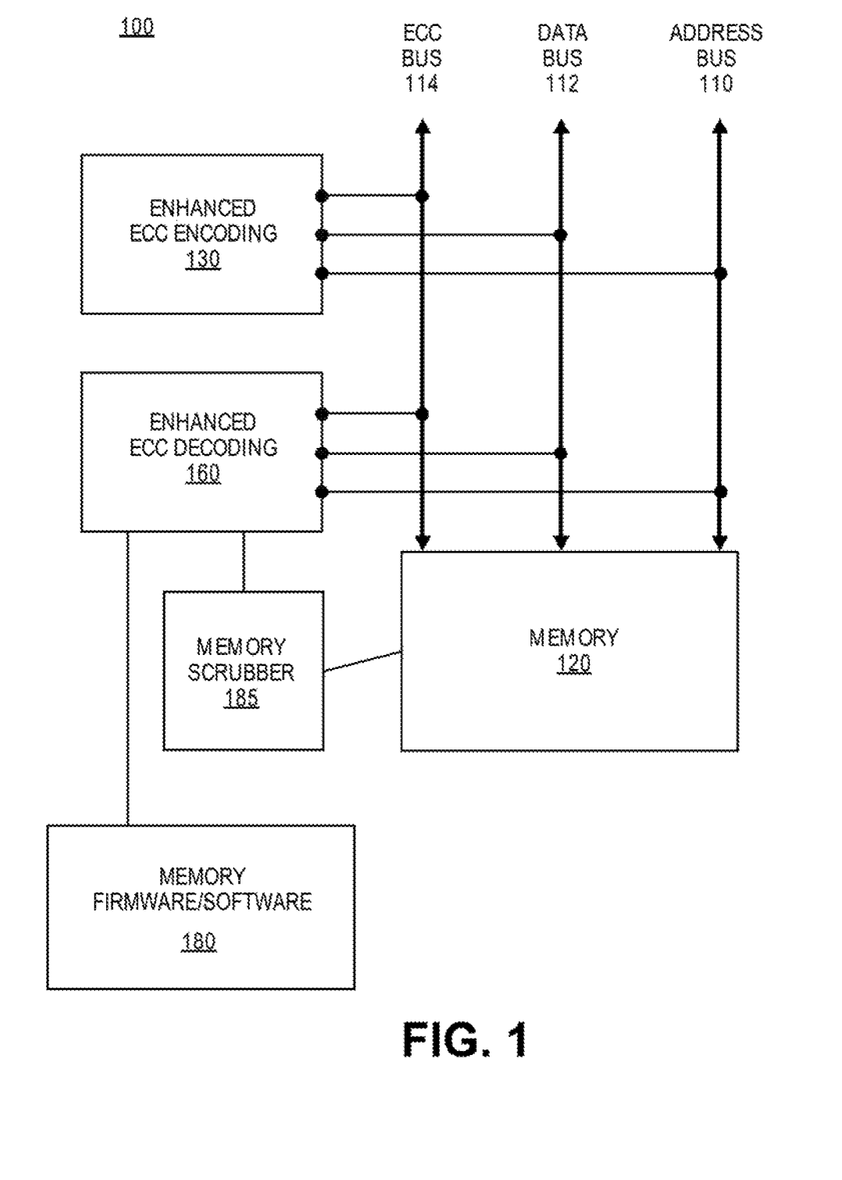
FIG. 1 is an illustration of a system for address protection in enhanced error correction code (ECC) according to an embodiment.

FIG. 1 is an illustration of a system or apparatus for address protection in enhanced error correction code (ECC) according to an embodiment. In some embodiments, a system or apparatus 100 provides for enhanced ECC encoding and decoding. In some embodiments, the system or apparatus 100 includes an enhanced ECC encoder or encoding logic 130 and an enhanced ECC decoder or decoding logic 160 for operation with a memory storage 120. A system or apparatus may further include multiple buses for signal transmission, including an address bus 110 for transmission of addresses for data, a data bus 112 for transmission of data, and an ECC bus 114 for transmission of ECC bits.

In some embodiments, upon receiving a write command to write data to the memory 120, the enhanced ECC encoder 130 is to generate ECC bits over both the data on the data bus 112 and the respective address in memory for the data on the address bus 110, the encoder 130 to transmit the generated ECC bits via the ECC bus 114 for storage with the respective address and data in the memory 120.

In some embodiments, upon receiving a read command to read data from the memory 120, the enhanced ECC decoder 160 is to receive the ECC bits, data and address over the noted buses. In some embodiments, the decoder 160 is to utilize such ECC, address, and data bits to detect errors in the address. In some embodiments, the detection of a fault results in action to handle the error, such as to roll the data stored in the memory back to an earlier state prior to the fault.

In some embodiments, the system or apparatus 100 may further include a memory scrubber element or logic 185 to scrub errors from memory 120 by reading data entries from the memory utilizing the enhanced ECC decoding to detect errors in memory storage.

In some embodiments, the ECC decoder 160 may further provide information regarding address faults to memory firmware or software 180 to handle issues of repeated address errors, such as to replace or avoid any defective address lines.

The location of enhanced ECC logic elements may vary depending on a particular implementation. In some embodiments, a memory module may include an ECC encoder 130 and ECC decoder 160. In some embodiments, a microprocessor or other element may include an ECC encoder 130 and ECC decoder 160.

Figure 2A:
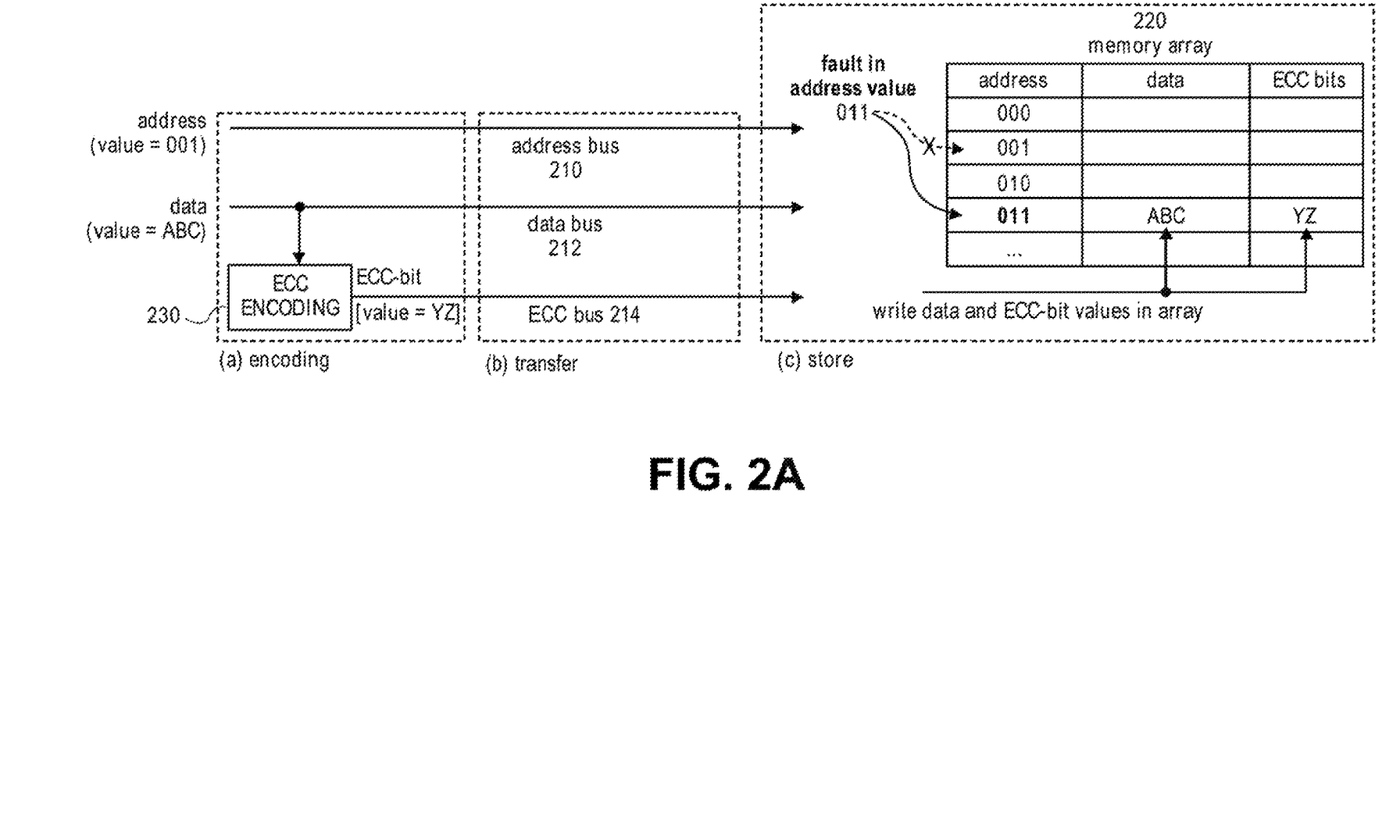
FIG. 2A is an illustration of a write operation in an ECC-protected memory when an address fault occurs.

FIG. 2A is an illustration of a write operation in an ECC-protected memory when an address fault occurs. Conventional ECC that is performed only over data is not capable of detecting address faults during a write or a read, which can result in silent data corruption. FIG. 2A provides an illustration of a write operation in conventional ECC-protected memory when a fault in address occurs.

In this example, ECC encoding 204 is first performed to generate ECC bits (for example, "YZ") for the data, wherein the ECC bits used to protect the data (for example, "ABC") against possible errors during data transmission or retention. The set of address bits on address bus 210, data bits on data bus 212, and ECC bits on ECC bus 214 are transferred to store the data bits and ECC bits in the memory location of memory array 230 that is indicated (pointed to) by the address value ("001" in this example).

However, in a circumstance in which address corruption occurs, such as the illustrated example in which the address "001" becomes "011" due to a flipped bit in the address, the data and ECC bits are stored in the incorrect memory location ("011"). This operation can result in silent data corruption because the operation may occur without detection, resulting in incorrect data storage in the 001 and 011 locations.

Figure 2B:
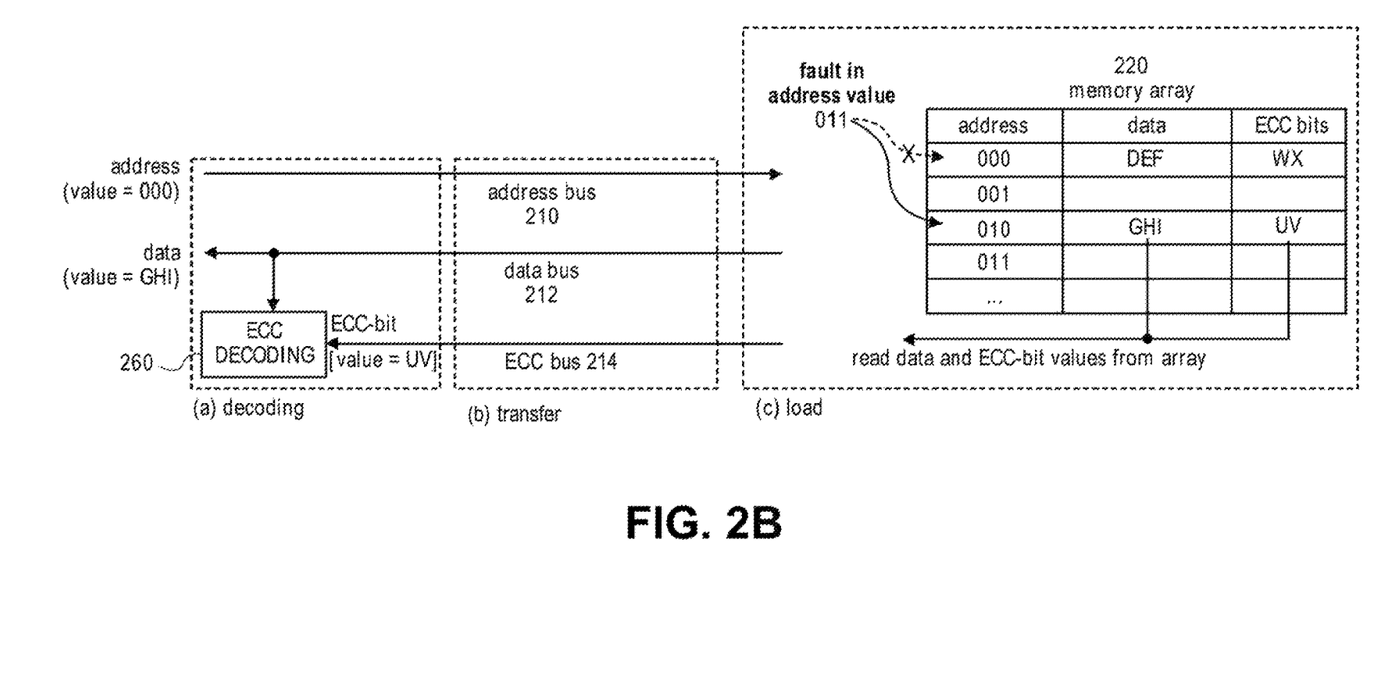
FIG. 2B is an illustration of a read operation in an ECC-protected memory when a fault in an address occurs.

FIG. 2B is an illustration of a read operation in an ECC-protected memory when a fault in an address occurs. In the example of the read operation illustrated in FIG. 2B, an address value (for example, "000") is transferred via address bus 210 in order to load (read) data from the memory array 230. As illustrated, data "DEF" with ECC bits "WX" are stored in the desired address location "000".

However, upon a fault in an address occurs ("000" becoming "010"), the data and ECC bits are loaded from the incorrect memory location. In the illustrated example, data "GHI" and ECC bits "UV" are stored in the address "010" that has been incorrectly provided. In this process, ECC decoding is used to detect/correct any errors in received data ("GHI"). In this example, if the original ECC encoding is successful, then the ECC bits "UV" will indicate no error in the stored data. However, this is incorrect data as the ECC decoding is not capable of detecting faults in the address, resulting in silent data corruption.

In some embodiments, a system or process instead provides detection of address faults within the error detection capability of the ECC protection scheme that is in use. In some embodiments, the detection of the address fault or faults may be performed either in subsequent reads of data or by a periodic memory scrub mechanism, which may then be followed by a rollback to a last fault-free software checkpoint or snapshot.

Figure 3A:
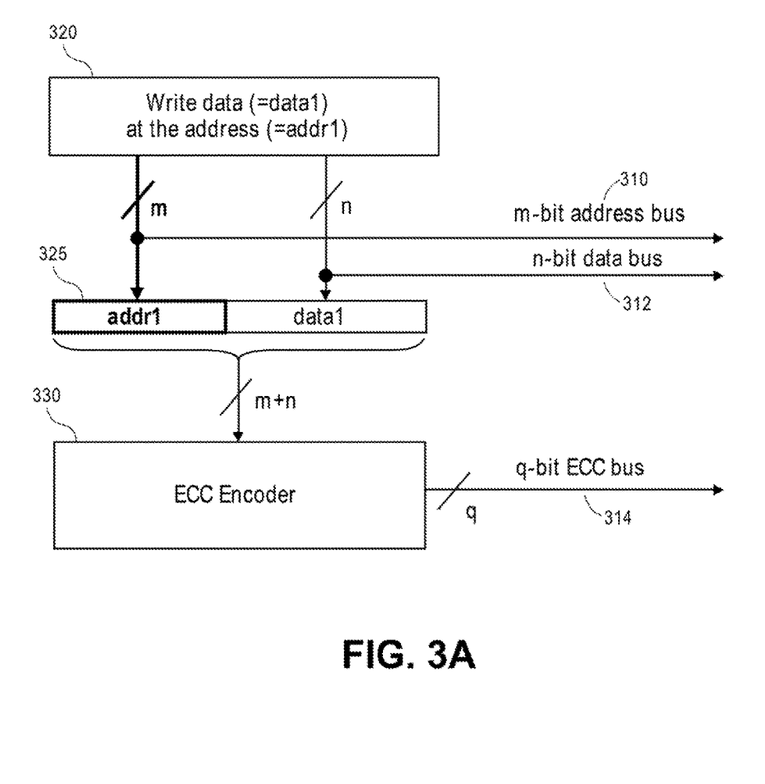
FIG. 3A is an illustration of encoding address fault detection according to an embodiment.

FIG. 3A is an illustration of encoding address fault detection according to an embodiment. In this illustration of enhanced ECC encoding the address width and data width are assumed to be m-bit and n-bit, as illustrated with m-bit address bus 320 and n-bit data bus 322.

In some embodiments, in contrast with a conventional ECC process that encodes only n-bit data, enhanced ECC encoding is performed over both the address bits and the data bits. In some embodiments, an enhanced ECC encoder 310 generates q ECC bits (via q-bit ECC bus 324) from an (m+n)-bit input value, representing m bits for the address and n bits for the associated data. In some embodiments, a pair of values, comprising an n-bit data value and a q-bit ECC value, are to be stored in the memory location pointed to by the m-bit address value, where the ECC value provides error protection both for the data bits and for the address bits associated with the data bits.

Figure 3B:
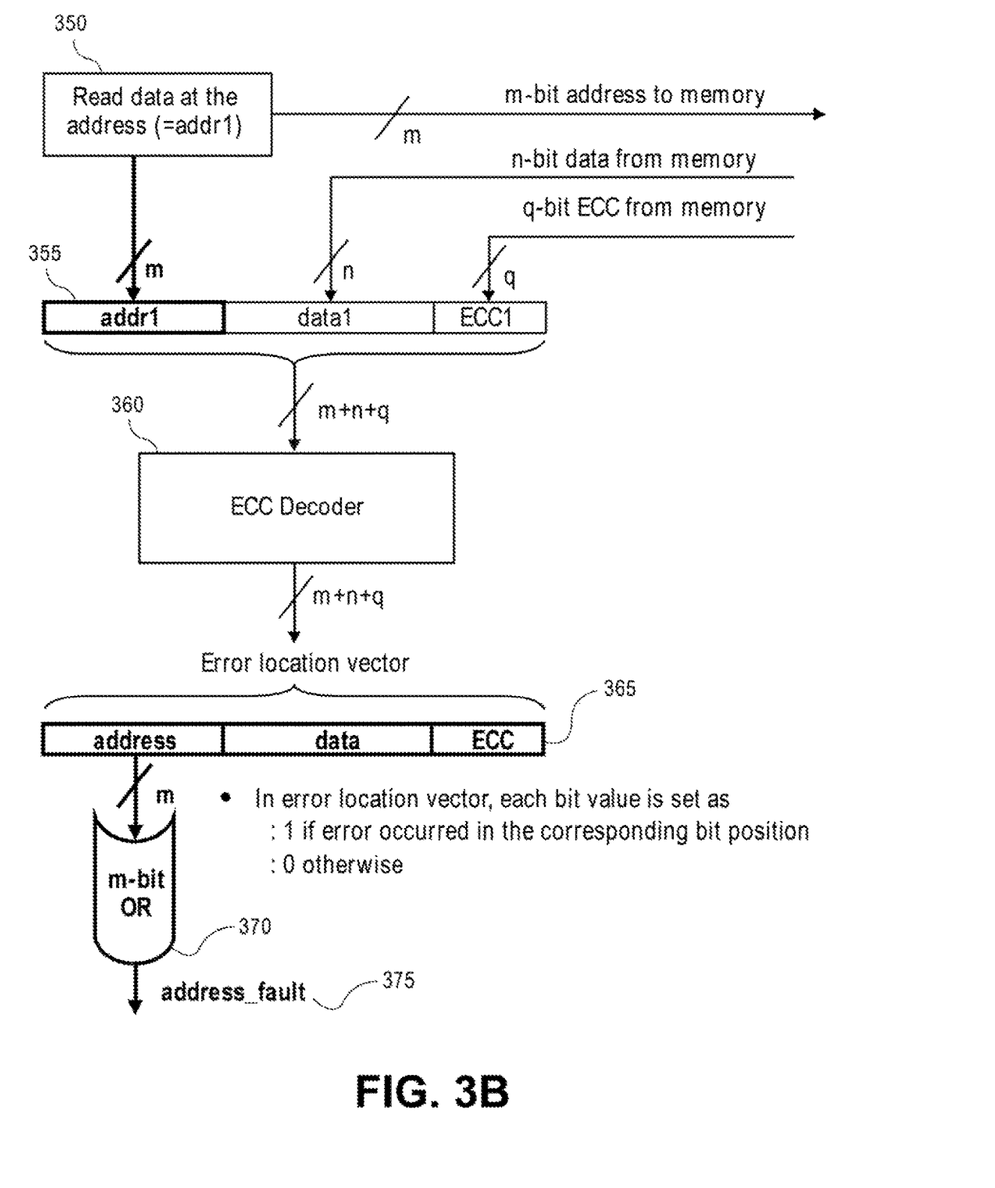
FIG. 3B is an illustration of encoding address fault detection according to an embodiment.

FIG. 3B is an illustration of encoding address fault detection according to an embodiment. As illustrated in FIG. 3B, there is again an m-bit value for an address, an n-bit value for data, and a q-bit value for the ECC generated for the (m+n)-bit address and data. In this illustration, there is a read operation 350 in which an m-bit address (for example, addr1) is provided to memory, with the read operation generating n-bit data from memory (data1) and q-bit ECC from memory (ECC1).

In some embodiments, an enhanced ECC decoder 355 receives the m+n+q bits 355 represented by addr1+data1+ECC1. In some embodiments, the decoder 360 is to decode such values and determine whether an error has occurred in the address. In a particular embodiment, the decoder 360 is to generate an error location vector 365 for the address ("address_fault") using an m-bit logical OR operator 370 as shown in FIG. 3B, wherein the error location vector is to, for example, have each bit value in which an error has occurred in the corresponding bit position be set as "1", with each bit values being set as "0" otherwise. Thus, if any errors occur in the code word corresponding to the address segment, the address_fault signal is asserted high. However, embodiments are not limited to the particular examples of the error location vector and address fault signal shown in FIG. 3B, but rather may be implemented with different signal structures.

In some embodiments, utilizing the enhanced ECC encoder 330 illustrated in FIG. 3A and the ECC decoder 360 illustrated in FIG. 3B, an apparatus, system, or process has the capability of detecting all address faults within the error detection capability of the ECC protection scheme.

Figure 4:
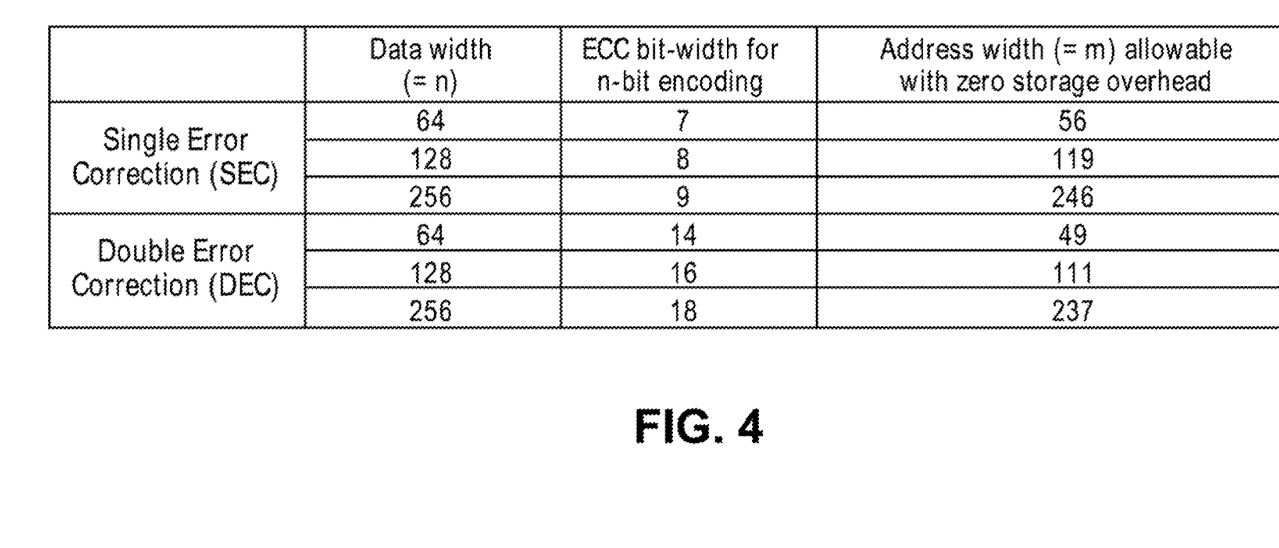
FIG. 4 is a table to illustrate data storage requirements in an enhanced system providing data encoding and decoding for memory address fault detection according to an embodiment.

FIG. 4 is a table to illustrate data storage requirements in an enhanced system providing data encoding and decoding for memory address fault detection according to an embodiment. As shown in the table, in most practical memory applications, there is no need to increase the amount of ECC bit storage that is utilized in a conventional ECC operation to provide for the proposed enhanced data encoding and decoding.

For example, 64-bit data encoding with SEC (single error correction) capability requires 7-bit ECC bits, which can jointly encode the address segment (up to maximum 56 bits)

without impacting the storage overhead. This is because the 7 ECC bits will protect 64 bits of data plus an additional 56 bits, and thus if the address is less than 56 bits there is no additional overhead cost in the enhancement of the ECC protection. Further, 64-bit data encoding with DEC (double error correction) requires 14 bits, with an address width of 49 bits allowable with zero storage overhead in comparison with conventional system.

Thus, as illustrated in FIG. 4, the maximum address space for most practical memory designs can easily fit within the allowable address bit-width with zero additional storage overhead required in comparison with conventional ECC protection of data.

Figure 5A:
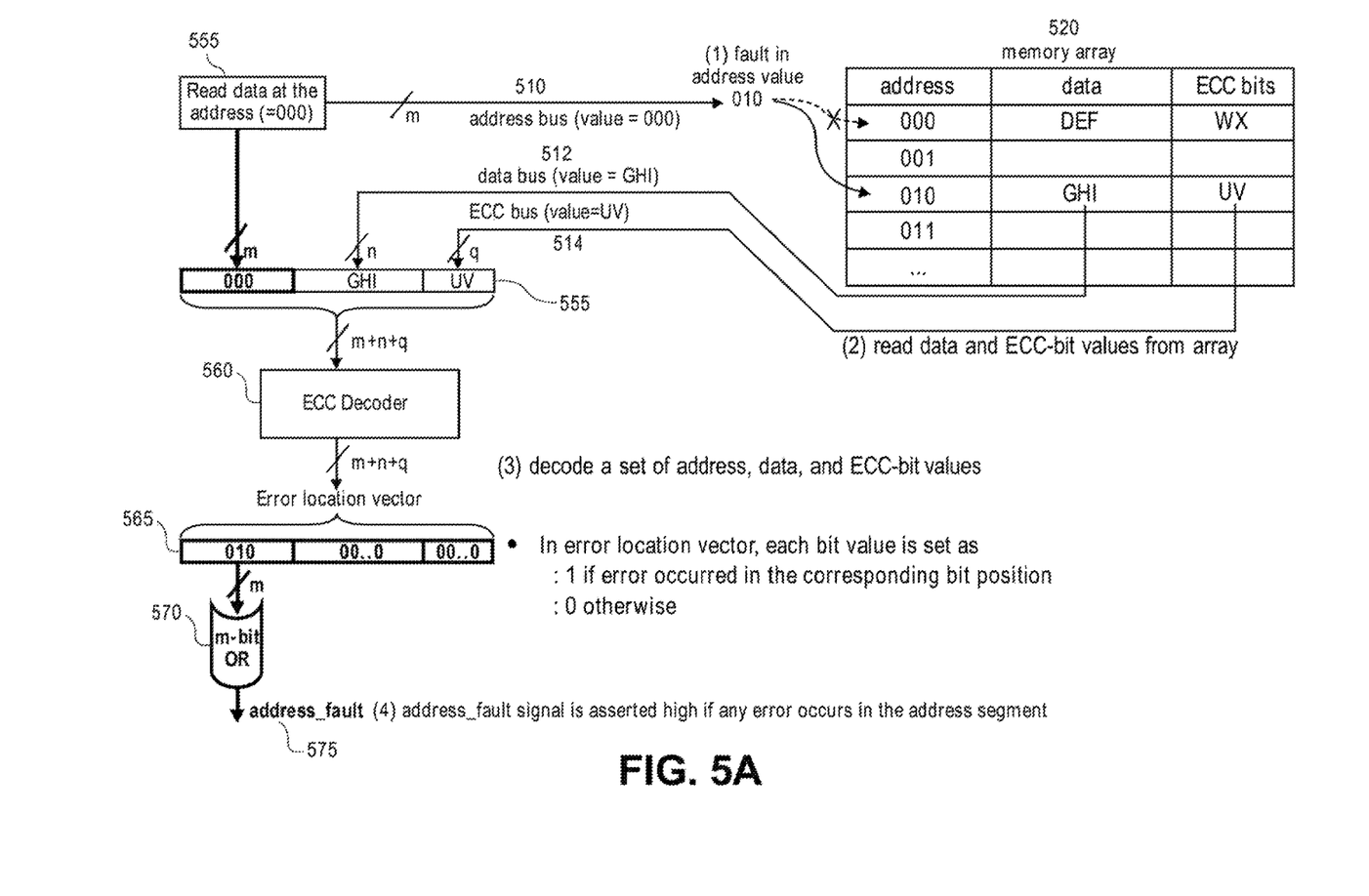
FIG. 5A is an illustration of an example of a memory read operation in which a fault is present according to an embodiment.

FIG. 5A is an illustration of an example of a memory read operation in which a fault is present according to an embodiment. In some embodiments, a memory read operation may proceed as follows:

(1) For a read operation 555, the address value (for example "000") is transferred via the address bus 510 in order to load data from the memory 520. However, the address fault on the bus 510 results in pointing to an incorrect memory location (for example "010").

(2) Data (="GHI") on the data bus 512 and ECC bits (="UV") on the ECC bus 514 are loaded from the incorrect memory location (="010"). In this example, the ECC bits were generated over both the data and the address in an enhanced ECC operation.

(3) ECC decoding is performed by enhanced ECC decoder 560 over a set 555 of address, data, and ECC bits. It is noted that the address bits used in the decoding process are the original address value (="000") whereas the data and ECC bits are read from the memory.

(4) ECC decoder 560 generates an error location vector 565 in which each bit value is logical '1' in the presence of an error in the corresponding bit position. In this simplified example, the m bits corresponding to the address field that are output by the decoder indicate that the middle address bit is in error. In some embodiments, each of the m-bit address selectors are then logically ORed together, illustrated as an m-bit OR operator 565, to generate the address_fault signal 575, which in this example is asserted high to indicate an address fault if an error occurs in any of the address bits.

Figure 5B:
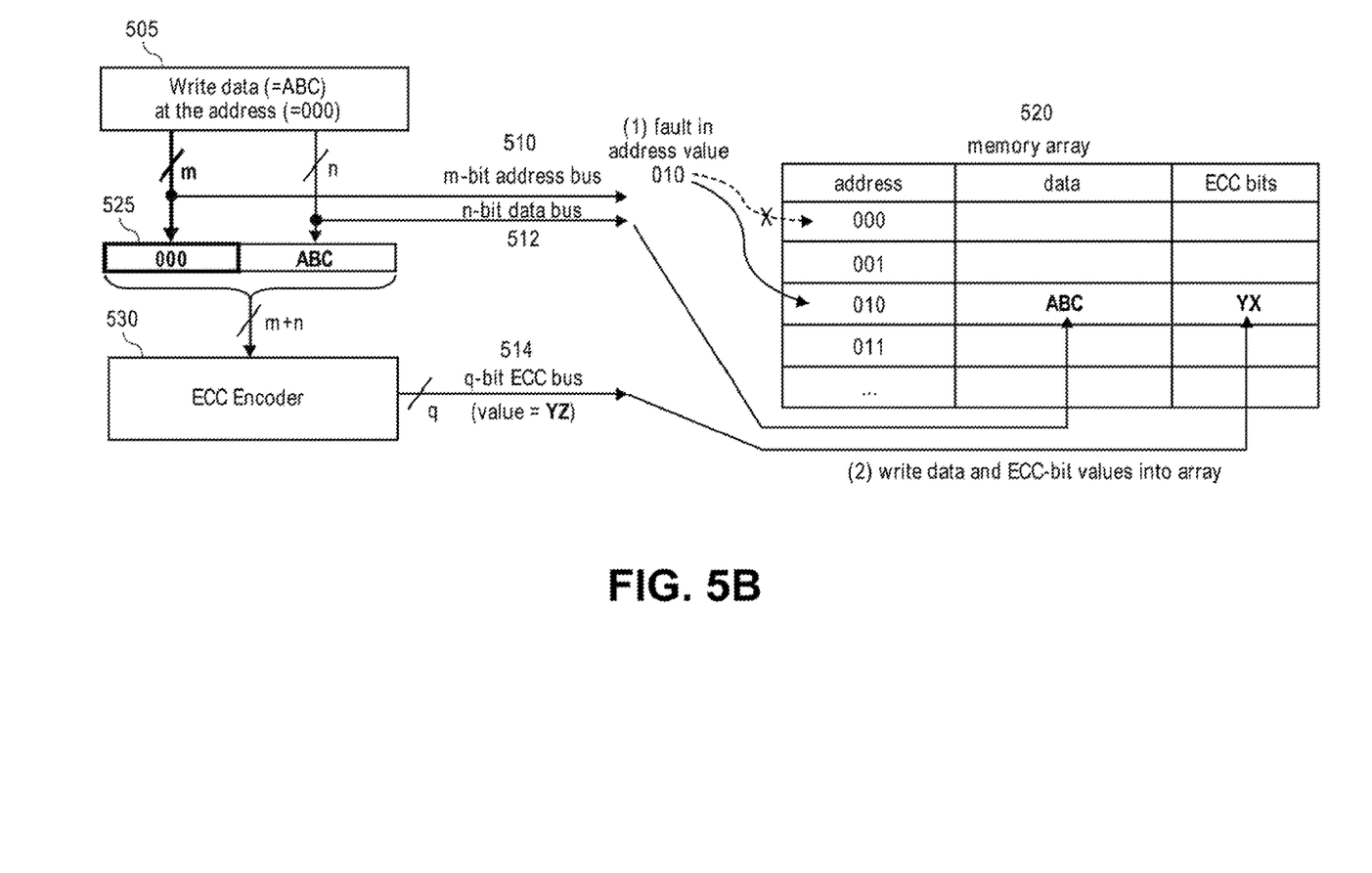
FIG. 5B is an illustration of an example of a memory write operation in which a fault is present according to an embodiment.

FIG. 5B is an illustration of an example of a memory write operation in which a fault is present according to an embodiment. In some embodiments, a memory write operation may proceed as follows:

(1) For a write data instruction 505 for a particular data set, ECC encoding is performed by ECC encoder 530 over both address and data bits, with the set of data (="ABC") and generated ECC bits (="YZ") 525 to be written into the memory location pointed by the address value (="000").

However in the presence of a particular address fault in which the middle bit is flipped, "ABC" and "YZ" are instead written into an incorrect location (="010").

(2) The above incorrect address write error will be detected if a subsequent read is made to the incorrect address (in this case address 010). In some embodiments, an apparatus, system, or process may also utilize periodic memory scrubbing to detect the incorrect writes to memory, such as illustrated with memory scrubber 185 in FIG. 1. In some embodiments, a memory scrub operation will read all the addresses for the memory array 520 and will detect if incorrect writes have been performed to any address, using, for example the technique as illustrated in FIG. 3B. In some embodiments, upon detecting an error, the memory is to roll back to the last error free checkpoint.

In some embodiments, because the error detection and correction process is able to detect and correct the address fault bits within the code's error correction capability, an apparatus, system, or process may further include firmware or software that identifies which address line or lines are failing, such as illustrated with memory firmware or software 180 in FIG. 1. Further, the diagnostics may be implemented together with online address line sparing (including avoidance or replacement of a particular line) or other redundancy mechanisms to address the line failure. For example, an apparatus, system, or process repeatedly detects errors in a particular line, the on-line redundancy mechanism can be invoked to avoid or replace that line.

Figure 6:
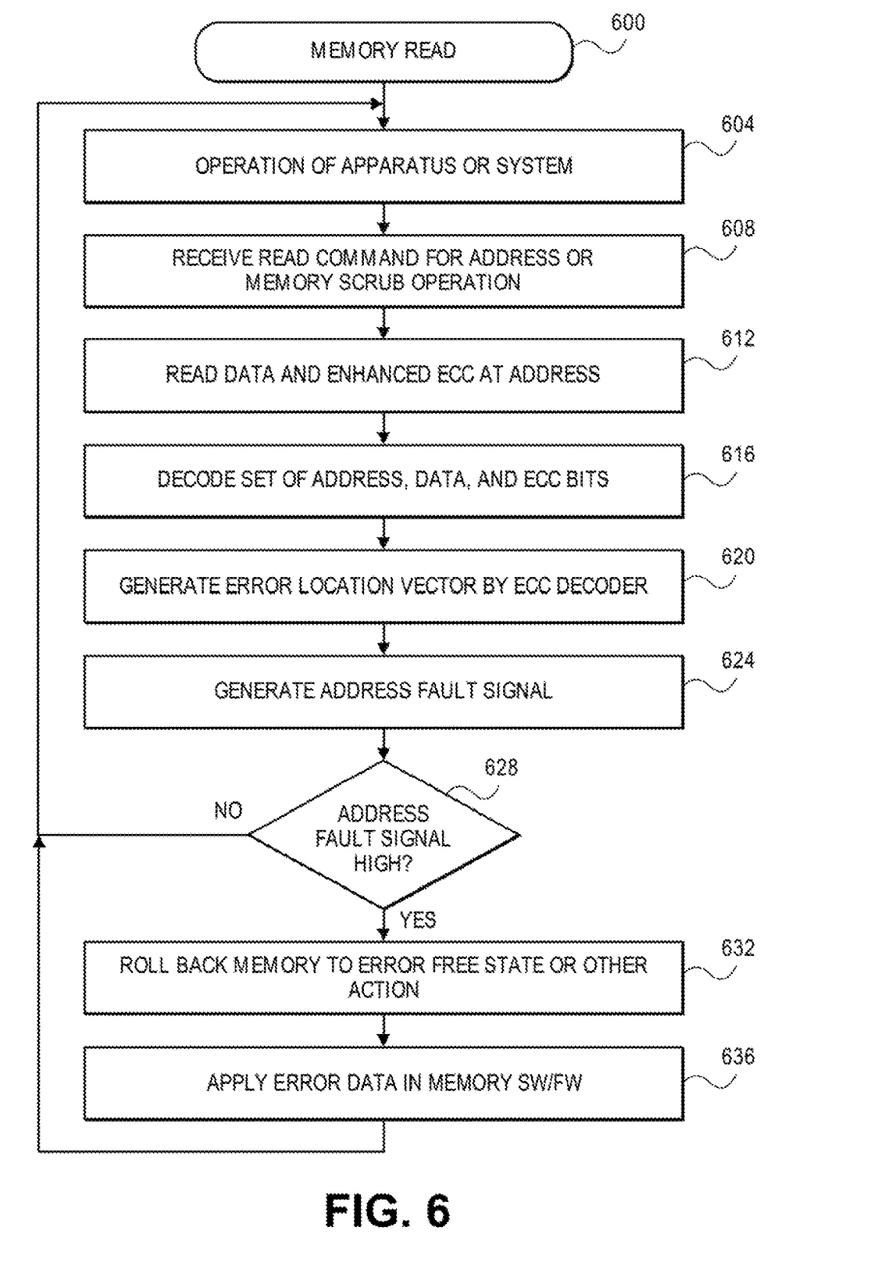
FIG. 6 is a flowchart to illustrate a memory read process according to an embodiment.

FIG. 6 is a flowchart to illustrate a memory read process according to an embodiment. In some embodiments, a process 600 may include, but is not limited to, the following:

604: Operation of an apparatus or system, such as a computing system, including a memory may be commenced.

608: A command to read data from a particular address in memory is received, or a memory read may occur in a memory scrub operation, in which, for example, each address of a memory may be read in order to detect if incorrect writes have been performed to any address.

612: The data bits and enhanced ECC bits are read from the address. However, in certain circumstances, one or more bits of the address may be flipped in an address error, in which case a read may be made from a wrong location in memory. In other circumstances, an earlier write may be made to an incorrect location in memory because of an address error.

616: The requested address and the received data and address bits are decoded.

620: An error location vector is generated to identify a bit position of any error in the address.

624: An address fault signal is generated, such as by performing a logical OR operation on the values of the error location vector. In one example, a High value (logical '1' value) of the address fault signal may indicate the existence of at least one error in an address, and a Low value (logical '0' value) may indicate that no errors in an address have been detected.

628: A determination may be made whether the address fault signal indicates (such as by a High value) that an address fault has occurred. If not, the process may return to the operations of the apparatus or system 604.

632: If the address fault signal indicates the existence of an address fault, the apparatus or system may perform an operation to address the address fault, such as roll back all or a portion of the memory to an earlier error free state, such as restoring a checkpoint or snapshot of an earlier memory state.

636: In some embodiments, the error data may further be applied in the apparatus or system, including, for example, operation of memory firmware or software of a system. For example, the apparatus or system may handle repeated errors on a particular address line by avoiding or replacing the address line with a redundancy operation, if this is available.

Figure 7:
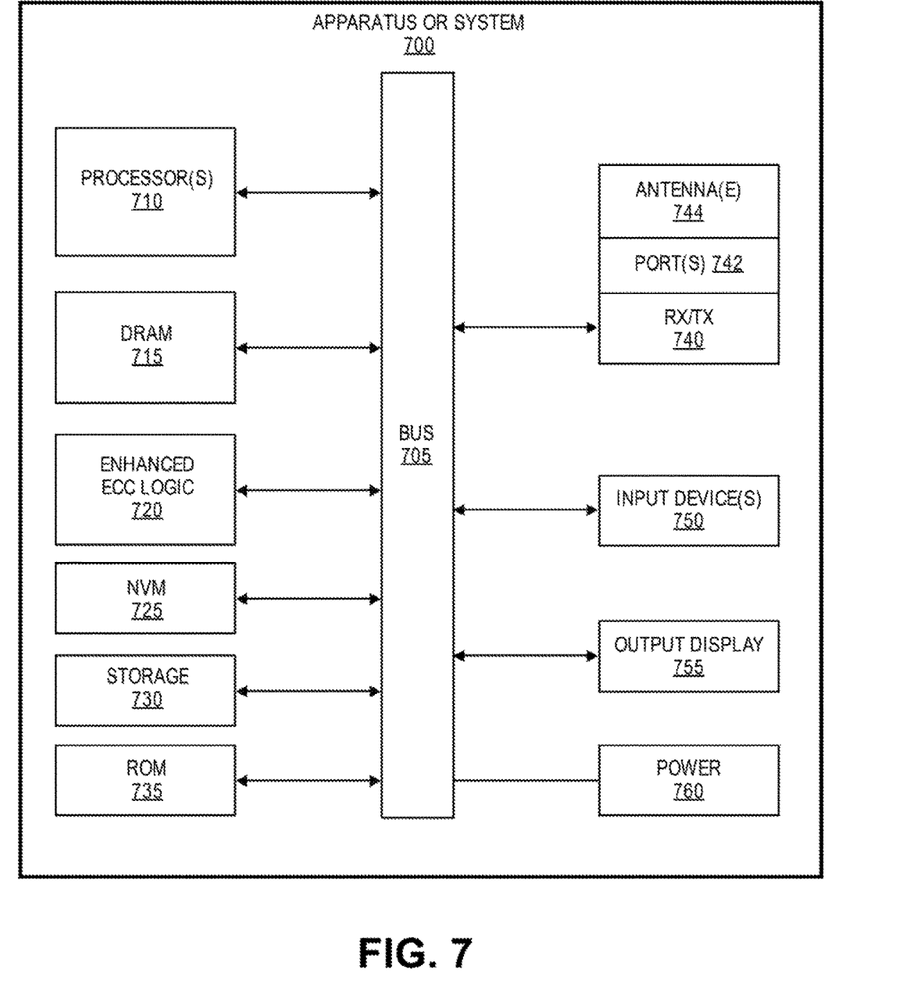
FIG. 7 is an illustration of an apparatus or system including enhanced error correction of data and address in memory according to an embodiment.

FIG. 7 is an illustration of an apparatus or system including enhanced error correction of data and address in memory according to an embodiment. In this illustration, certain standard and well-known components that are not germane to the present description are not shown. Elements shown as separate elements may be combined, including, for example, an SoC (System on Chip) combining multiple elements on a single chip. An apparatus or system 700, such as a computing system, may include, but is not limited to, a personal computer or server.

In some embodiments, the apparatus or system 700 includes processing means (or processing units) such as one or more processors 710 coupled to one or more buses or interconnects, shown in general as bus 705. The processors 710 may comprise one or more physical processors and one or more logical processors. In some embodiments, the processors may include one or more general-purpose processors or special-processor processors. The bus 705 is a communication means for transmission of data. The bus 705 is illustrated as a single bus for simplicity, but may represent multiple different interconnects or buses and the component connections to such interconnects or buses may vary. The bus 705 shown in FIG. 7 is an abstraction that represents any one or more separate physical buses, point-to-point connections, or both connected by appropriate bridges, adapters, or controllers. In some embodiments, a processor 710 includes a memory controller or operates with an external memory controller.

In some embodiments, the apparatus or system 700 further comprises a random access memory (RAM) 715 or other dynamic storage device or element as a main memory for storing information and instructions to be executed by the processors 710. Main memory 715 may include, but is not limited to, dynamic random access memory (DRAM), as illustrated in FIG. 7.

In some embodiments, the apparatus or system 700 further includes enhanced ECC logic 720, which is illustrated as a separate element for ease of illustration. In some embodiments, the ECC logic may be a part of the processor 710, the main memory 715, or other element of the apparatus or system 700. In some embodiments, the enhanced ECC logic provides for ECC encoding and decoding for both data and addresses associated with the data, such as illustrated in FIGS. 3A, 3B, 5A, and 5B.

The apparatus or system 700 also may comprise a non-volatile memory (NVM) 725; a storage device such as a solid state drive (SSD) 730; and a read only memory (ROM) 735 or other static storage device for storing static information and instructions for the processors 710. NVM 725 may include, for example, block addressable memory device, such as NAND or NOR technologies, phase change memory (PCM), three dimensional cross point memory, or other byte addressable nonvolatile memory devices, memory devices that use chalcogenide phase change material, resistive memory, nanowire memory, ferro-electric transistor random access memory (FeTRAM), flash memory such as solid state disk (SSD) NAND or NOR, multi-threshold level NAND flash memory, NOR flash memory, magnetoresistive random access memory (MRAM) memory that incorporates memristor technology, spin transfer torque (STT)-MRAM, or a combination of any of the above, or other memory.

In some embodiments, the apparatus or system 700 includes one or more transmitters or receivers 740 coupled to the bus 705 to provide wired or wireless communications. In some embodiments, the apparatus or system 700 may include one or more antennae 744, such as dipole or monopole antennae, for the transmission and reception of data via wireless communication using a wireless transmitter, receiver, or both, and one or more ports 742 for the transmission and reception of data via wired communications. Wireless communication includes, but is not limited to, Wi-Fi, Bluetooth™, near field communication, and other wireless communication standards.

In some embodiments, apparatus or system 700 includes one or more input devices 750 for the input of data, including hard and soft buttons, a joy stick, a mouse or other pointing device, a keyboard, voice command system, or gesture recognition system.

In some embodiments, the apparatus or system 700 includes an output display 755, where the display 755 may include a liquid crystal display (LCD) or any other display technology, for displaying information or content to a user. In some environments, the display 755 may include a touch-screen that is also utilized as at least a part of an input device 750. Output display 755 may further include audio output, including one or more speakers, audio output jacks, or other audio, and other output to the user.

The apparatus or system 700 may also comprise a battery or other power source 760, which may include a solar cell, a fuel cell, a charged capacitor, near field inductive coupling, power adapter, or other system or device for providing or generating power in the apparatus or system 700. The power provided by the power source 760 may be distributed as required to elements of the apparatus or system 700.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, read-only memory (ROM), random access memory (RAM), erasable programmable read-only memory (EPROM), electrically-erasable programmable read-only memory (EEPROM), magnetic or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, an apparatus includes a memory array; an error correction code (ECC) encoder for the memory array to encode ECC values based on a data value and a respective address value for the data value; and an ECC decoder for the memory array to decode ECC values that are based on data values and respective addresses for the data values, wherein the apparatus is to detect and correct an error in an address value based on an ECC value, address value, and data value stored in the memory array.

In some embodiments, the apparatus further includes a first bus for address values, a second bus for data values, and a third bus for ECC values, wherein the ECC encoder and ECC decoder are to read values from both the first bus and the second bus.

In some embodiments, the ECC decoder is to generate an error location vector to indicate a bit position of each detected error in the address value.

In some embodiments, the apparatus is to generate an address fault signal based on a value of the error location vector.

In some embodiments, the apparatus further includes an address scrubber to read data from a plurality of addresses of the memory array to detect errors in addresses for the memory array based on the ECC values, address values, and data values stored in the memory array.

In some embodiments, the apparatus is to roll back stored values of all or a portion of the memory array to an earlier state upon detecting an error in an address value for a respective data value.

In some embodiments, the apparatus is to perform memory diagnostics in response to one or more errors in address values that are detected.

In some embodiments, a size of an ECC value for a data value and a respective address value is a same size as an ECC value for the data value without the respective address value.

In some embodiments, the apparatus is a memory module.

In some embodiments, a method includes receiving a command to read a data value at an address value of a memory array; reading a data value and an error correction code (ECC) value based on the address, wherein the ECC value is generated based on the data value and the address value; performing a decoding operation using the requested address value and the data value and ECC value read from the memory array; and identifying one or more errors in the address value based on the decoding operation.

In some embodiments, identifying errors includes generating an error location vector to indicate a location of each detected error in the address value.

In some embodiments, the method further includes generating an address fault signal based on a value of the error location vector.

In some embodiments, the method further includes rolling back stored values of all or a portion of the memory array to an earlier state in response to detecting an error in an address value for a respective data value.

In some embodiments, the command to read a data value is a part of a scrubbing operation for the memory array. In some embodiments, the scrubbing operation includes values stored at each address of the memory array.

In some embodiments, the method further includes performing memory diagnostics in response to detection of one or more errors in address values.

In some embodiments, a computing system includes one or more processors for processing of data; a memory apparatus for the storage of data, the memory apparatus including a memory array; and a wireless transmitter or receiver and one or more antennae for the transmission or reception of data. In some embodiments, the computing system further includes error correction code (ECC) logic, including an ECC encoder to encode ECC values based on a data value and a respective address value for the data value, and an ECC decoder to decode ECC values that are based on data values and respective addresses for the data values, wherein the ECC logic is to detect and correct an error in an address value based on an ECC value, address value, and data value stored in the memory array.

In some embodiments, the computing system further includes a first bus for address values, a second bus for data values, and a third bus for ECC values, wherein the ECC encoder and ECC decoder are to read values from both the first bus and the second bus.

In some embodiments, the computing system further includes an address scrubber to read data from a plurality of addresses of the memory array to detect errors in addresses for the memory array based on the ECC values, address values, and data values stored in the memory array.

In some embodiments, the computing system is to roll back stored values of all or a portion of the memory array to an earlier state upon detecting an error in an address value for a respective data value.

In some embodiments, one or more non-transitory computer-readable storage mediums having stored thereon data representing sequences of instructions that, when executed by one or more processors, cause the one or more processors to perform operations including: receiving a command to read a data value at an address value of a memory array; reading a data value and an error correction code (ECC) value based on the address value, wherein the ECC value is generated based on the data value and the address value; performing a decoding operation using the requested address value and the data value and ECC value read from the memory array; and identifying one or more errors in the address value based on the decoding operation.

In some embodiments, the instructions further include instructions for rolling back stored values of all or a portion of the memory array to an earlier state in response to detecting an error in an address value for a respective data value.

In some embodiments, the instructions further include instructions for performing a scrubbing operation for the memory array, including reading a data value and an error correction code (ECC) value based on an address value for each of a plurality of addresses of the memory array.

In some embodiments, an apparatus includes means for receiving a command to read a data value at an address value of a memory array; means for reading a data value and an error correction code (ECC) value based on the address value, wherein the ECC value is generated based on the data value and the address value; means for performing a decoding operation using the requested address value and the data value and ECC value read from the memory array; and means for identifying one or more errors in the address value based on the decoding operation.

In some embodiments, the apparatus further includes means for rolling back stored values of all or a portion of the memory array to an earlier state in response to detecting an error in an address value for a respective data value.

In some embodiments, the apparatus further includes means for performing a scrubbing operation for the memory array, including reading a data value and an error correction code (ECC) value based on an address value for each of a plurality of addresses of the memory array.

What is claimed is:

1. An apparatus comprising:
    a memory array;
    an error correction code (ECC) encoder circuit for the memory array to encode, during a write operation of a data value into the memory array, an ECC value based on the data value and a write address value for the data value;
    an ECC decoder circuit for the memory array to receive, during a read operation of the data value, a read ECC value and a read data value from the memory array and to receive a read address value for the data value;
    wherein the apparatus is to detect and correct an error in the write or read address values based on the read ECC value, the read address value, and the read data value;
    wherein the apparatus is to roll back stored data values of all or a portion of the memory array to an earlier state upon detecting the error in the read or write address values.

2. The apparatus of claim 1, further comprising a first bus for address values, a second bus for data values, and a third bus for ECC values, the first, second and third busses to be coupled to the memory array, wherein the ECC encoder circuit is to receive address values for the first bus and data values for the second bus.

3. The apparatus of claim 1, wherein the ECC decoder circuit is to generate an error location vector to indicate an address bit position of each detected error.

4. The apparatus of claim 3, wherein the apparatus is to generate an address fault signal based on a value of the error location vector.

5. The apparatus of claim 1, further comprising an address scrubber to read data values and their corresponding ECC values from the memory array at a plurality of read address values and to detect errors in the data values' corresponding read or write address values based on the read address values, the data values and their corresponding ECC values.

6. The apparatus of claim 1, wherein the apparatus is to perform memory diagnostics in response to one or more detected errors in read or write address values.

7. The apparatus of claim 1, wherein a size of the ECC value for the data value and the write address value is a same size as another ECC value for the data value without the write address value.

8. The apparatus of claim 1, wherein the apparatus is a memory module.

9. A method comprising:
    receiving a command to read from a memory array at an address value;
    reading a data value and an error correction code (ECC) value from the memory array based on the address value, wherein, during a previous write of the data value, the ECC value was generated based on the data value and its write address value;
    performing a decoding operation using the address value, the data value and the ECC value;
    identifying one or more errors in the address value or write address value based on the decoding operation; and,
    rolling back stored data values of all or a portion of the memory array to an earlier state upon detecting the one or more errors.

10. The method of claim 9, wherein the identifying one or more errors includes generating an error location vector to indicate a location of each detected error in the address or write address value.

11. The method of claim 10, further comprising generating an address fault signal based on a value of the error location vector.

12. The method of claim 9, wherein the command to read the data value is part of a scrubbing operation for the memory array.

13. The method of claim 12, wherein the scrubbing operation includes reading values stored at each address of the memory array.

14. The method of claim 9, further comprising performing memory diagnostics in response to the identifying of one or more errors in the address value or write address value.

15. A computing system comprising:
    one or more processors for processing of data;
    a memory apparatus for storage of data, the memory apparatus including a memory array;
    a wireless transmitter or receiver and one or more antennae for transmission or reception of data; and,
    the computing system further comprising error correction code (ECC) logic, including:
        an ECC encoder to encode an ECC value based on a data value and a respective write address value for the writing of the data value into the memory array,
        an ECC decoder to receive a read ECC value and read data value from the memory array and to also receive a read address value;
    wherein the ECC logic is to detect and correct an error in the read or write address values based on the read ECC value, the read address value, and the read data value;
    wherein the apparatus is to roll back stored data values of all or a portion of the memory array to an earlier state upon detecting the error in the read or write address values.

16. The system of claim 15, further comprising a first bus for address values and a second bus for data values, the first and second busses to be coupled to the memory array, wherein the ECC encoder circuit is to receive address values for the first bus and data values for the second bus.

17. The system of claim 15, further comprising an address scrubber to read data values from a plurality of addresses of the memory array and to detect errors in the addresses based on ECC values, the addresses, and the data values.

18. One or more non-transitory computer-readable storage mediums having stored thereon data representing sequences of instructions that, when executed by one or more processors, cause the one or more processors to perform operations comprising:
   receiving a command to read from a memory array at an address value;
   reading a data value and an error correction code (ECC) value from the memory array based on the address value, wherein, during a previous write of the data value, the ECC value was generated based on the data value and its write address value;
   performing a decoding operation using the address value, the data value and the ECC value; and,
   identifying one or more errors in the address value or write address value based on the decoding operation; and,
   rolling back stored data values of all or a portion of the memory array to an earlier state upon detecting the one or more errors.

19. The storage mediums of claim 18, further comprising instructions that, when executed by the one or more processors, cause the one or more processors to perform operations comprising:
   reading data values from a plurality of addresses of the memory array and detecting errors in the addresses based on ECC values, the addresses, and the data values.

* * * * *